US011610801B2

(12) United States Patent
Prenger et al.

(10) Patent No.: US 11,610,801 B2
(45) Date of Patent: Mar. 21, 2023

(54) LASER-RELEASABLE BONDING MATERIALS FOR 3-D IC APPLICATIONS

(71) Applicant: Brewer Science, Inc., Rolla, MO (US)

(72) Inventors: Luke Prenger, Rolla, MO (US); Arthur O. Southard, St. James, MO (US); Qi Wu, Phoenix, AZ (US); Xiao Liu, Rolla, MO (US)

(73) Assignee: Brewer Science, Inc., Rolla, MO (US)

( * ) Notice: Subject to any disclaimer, the term of this patent is extended or adjusted under 35 U.S.C. 154(b) by 430 days.

(21) Appl. No.: 16/747,271

(22) Filed: Jan. 20, 2020

(65) Prior Publication Data

US 2020/0234993 A1 Jul. 23, 2020

Related U.S. Application Data (60) Provisional application No. 62/795,092, filed on Jan. 22, 2019.

(51) Int. Cl.
| | | |
|---|---|---|
| *H01L 21/683* | (2006.01) | |
| *C08G 73/02* | (2006.01) | |
| *H01L 21/56* | (2006.01) | |
| *B32B 43/00* | (2006.01) | |

(52) U.S. Cl.
CPC ........ *H01L 21/6835* (2013.01); *B32B 43/006* (2013.01); *C08G 73/026* (2013.01); *H01L 21/568* (2013.01); *B32B 2457/00* (2013.01)

(58) Field of Classification Search
None
See application file for complete search history.

(56) References Cited

U.S. PATENT DOCUMENTS

| | | |
|---|---|---|
| 5,955,199 A | 9/1999 | Johnson et al. |
| 2007/0185310 A1 | 8/2007 | Moore et al. |
| 2008/0173970 A1 | 7/2008 | Pillalamarri |
| 2008/0274327 A1 | 11/2008 | Dean et al. |
| 2009/0038750 A1 | 2/2009 | Hong et al. |
| 2009/0218560 A1 | 9/2009 | Flaim et al. |
| 2010/0112305 A1 | 5/2010 | Hong et al. |
| 2012/0283407 A1 | 11/2012 | Hoppin |
| 2014/0103499 A1 | 4/2014 | Andry et al. |

(Continued)

FOREIGN PATENT DOCUMENTS

| | | |
|---|---|---|
| CN | 102803337 | 3/2015 |
| JP | 2007-045939 | 2/2007 |

OTHER PUBLICATIONS

International Search Report and Written Opinion dated Jun. 5, 2020 in corresponding PCT/US2020/014272 filed Jan. 20, 2020, 12 pages.

(Continued)

*Primary Examiner* — Jack S Chen
(74) *Attorney, Agent, or Firm* — Hovey Williams LLP (57) ABSTRACT

Novel polyketanil-based compositions for use as a laser-releasable composition for temporary bonding and laser debonding processes are provided. The inventive compositions can be debonded using various UV lasers, at wavelengths from about 300 nm to about 360 nm, leaving behind little to no debris. The layers formed from these compositions possess good thermal stabilities and are resistant to common solvents used in semiconductor processing. The compositions can also be used as build-up layers for redistribution layer formation.

9 Claims, 3 Drawing Sheets

(56) References Cited

U.S. PATENT DOCUMENTS

| | | |
|---|---|---|
| 2015/0194331 A1 | 7/2015 | Bai et al. |
| 2016/0013088 A1 | 1/2016 | Koyama et al. |
| 2016/0023436 A1* | 1/2016 | Liu .................... C08G 73/1014 216/53 |
| 2016/0049324 A1 | 2/2016 | Yamaguchi et al. |
| 2016/0122601 A1 | 5/2016 | Bai et al. |
| 2016/0133499 A1 | 5/2016 | Allen et al. |
| 2019/0194453 A1* | 6/2019 | Liu ......................... H01L 24/81 |
| 2020/0234993 A1* | 7/2020 | Prenger ................ C09D 161/20 |

OTHER PUBLICATIONS

International Preliminary Report on Patentability dated Aug. 5, 2021 in corresponding PCT/US2020/014272 filed Jan. 20, 2020, 11 pages.
Machine Translation of JP2007045939, 24 pages.
Supplementary Search Report dated Aug. 9, 2022 in corresponding European Patent Application No. 20744369.8, 2 pages.
Form 1703 from Supplementary Search Report dated Aug. 9, 2022 in corresponding European Patent Application No. 20744369.8, 2 pages.
Search Report dated Sep. 27, 2022 in corresponding Singaporean Patent Application No. 11202107879P, 3 pages.
Written Opinion dated Oct. 4, 2022 in corresponding Singaporean Patent Application No. 11202107879P, 6 pages.
Iwan et al., "Processible polyazomethines and polyketanils: From aerospace to light-emitting diodes and other advanced applications," Progress in Polymer Science, Mar. 1, 2008, vol. 33, No. 3, pp. 289-345, 3 pages (abstract only attached).

* cited by examiner

LASER-RELEASABLE BONDING MATERIALS FOR 3-D IC APPLICATIONS

RELATED APPLICATIONS

The present application claims the priority benefit of U.S. Provisional Patent Application Ser. No. 62/795,092, filed Jan. 22, 2019, entitled LASER-RELEASABLE BONDING MATERIALS FOR 3-D IC APPLICATIONS, incorporated by reference in its entirety herein.

BACKGROUND

Field of the Invention

The present invention relates to laser-releasable compositions for use in temporary wafer bonding processes or for use as a build-up layer in during redistribution layer formation.

Description of Related Art

Temporary wafer bonding ("TWB") normally refers to a process for attaching a device wafer or microelectronic substrate to a carrier wafer or substrate by means of a polymeric bonding material. After bonding, the device wafer may be thinned typically to less than 50 μm and/or processed to create through-silicon vias ("TSV"), redistribution layers, bond pads, and other circuit features on its backside. The carrier wafer supports the fragile device wafer during the backside processing, which can entail repeated cycling between ambient temperatures and high temperatures (>250° C.), mechanical shocks from wafer handling and transfer steps, and strong mechanical forces, such as those imposed during wafer back-grinding processes used to thin the device wafer. When all of this processing has been completed, the device wafer is usually attached to a film frame and then separated (i.e., debonded) from the carrier wafer and cleaned before further operations take place.

Most TWB processes use either one or two layers between the device substrate and the carrier substrate. Depending on the TWB process, the device and carrier substrate can be separated by a variety of separation methods, such as chemical debonding, thermal slide debonding, mechanical debonding, or laser debonding, with the latter becoming a preferred debonding method. In the case of a one-layer, laser debond system, the bonding layer responds to radiation from a laser or other light source, which leads to decomposition of the layer itself, causing bonding integrity to be lost within the structure and allowing it to come apart without applying mechanical force. In the case of a two-layer laser debond system, a second polymeric bonding material layer is utilized, typically adjacent to the device surface. The second layer is easily cleaned from the device wafer surface after the post-processing destruction of the laser-sensitive layer and separation of the bonded wafer pair.

Laser-induced release materials are available for operating at laser wavelengths ranging from ultraviolet (e.g., 248 nm, 308 nm and 355 nm) to near infrared (e.g., 1064 nm) wavelengths. Laser release technology provides high throughput and low stress during the release process, effective thin-substrate handling, and ease of application, even with large panels. Laser release technology that can be utilized in different applications in packaging areas such as temporary bonding, fan-out wafer-level packaging, lamination, 2.5D/3D integration using through-silicon vias (TSVs), system-in-packaging ("SiP"), package-on-package ("PoP"), and other heterogeneous integration infrastructures is needed. This technology requires laser release materials that have high sensitivity, thus allowing for lower energy application, shorter debond times, and less debris after debonding.

SUMMARY OF THE INVENTION

The present invention broadly comprises a temporary bonding method comprising providing a stack comprising:
  a first substrate having a back surface and a front surface;
  a bonding layer adjacent the front surface;
  a second substrate having a first surface; and
  a release layer between the first surface and the bonding layer, with the release layer comprising a polyketanil. The release layer is exposed to laser energy so as to facilitate separation of the first and second substrates.

The invention also provides a microelectronic structure comprising:
  a first substrate having a back surface and a front surface;
  a bonding layer adjacent the front surface;
  a second substrate having a first surface; and
  a release layer between the first surface and the bonding layer, with the release layer comprising a polyketanil.

In another embodiment, the invention also provides a method of forming a release layer. The method comprises applying a composition to a substrate surface comprising glass or other transparent material. The composition comprises a polyketanil dissolved or dispersed in a solvent system. The composition is heated at a temperature of from about 60° C. to about 350° C. to form the release layer.

In a further embodiment, the inventive method comprises forming a build-up layer on the surface of a substrate. The build-up layer comprises a polyketanil and has an upper surface that is remote from the surface of the substrate. A first redistribution layer is formed on the upper surface and optionally one or more additional redistribution layers is formed on the first redistribution layer.

In yet a further embodiment, a microelectronic structure comprises a substrate having a surface. A build-up layer is on the substrate surface, and the build-up layer comprises a polyketanil and has an upper surface that is remote from the substrate surface. There is a first redistribution layer on the upper surface.

Another embodiment of the invention provides a polymer comprising recurring monomers of where each of $R_1$ to $R_4$:
  can be the same or different; and
  is individually selected from the group consisting of hydrogen, alkyls, alkoxys, hydroxyls, and polyethylene glycol chains.

DETAILED DESCRIPTION

The present invention is concerned with novel laser-releasable compositions or build-up compositions as well as methods of using those compositions.

Laser-Releasable or Build-Up Polymers and Compositions

1. Polyketanils

The compositions for use in the present invention comprise polyketanils, which are sometimes referred to as polyketimines. A ketanil bond is one that forms between a ketone group and amine group. This bond preferably comprises a carbon atom double-bonded to a nitrogen atom. The carbon atom that is part of the double bond is preferably bonded to two other carbon atoms (one or both of which is preferably part of an aromatic structure), while the nitrogen atom that is part of the double bond is preferably bonded to another carbon atom, with that other carbon atom being part of an aromatic structure. The foregoing aromatic structures are preferably phenyl groups. The ring members of the phenyl groups can be unsubstituted or substituted (e.g., with —NH$_2$).

In one preferred embodiment, the polyketanil used in the present invention is polymerized from a monomer having an amine functional group and a ketone functional group. The monomer also comprises an aromatic moiety, and both the amine and ketone functional groups are bonded to the aromatic moiety. A preferred structure for this monomer is:

where:
each of $R_1$ to $R_4$ can be the same or different; and
each of $R_1$ to $R_4$ is selected from the group consisting of hydrogen, alkyls (preferably $C_1$-$C_{10}$ and more preferably $C_1$-$C_6$), alkoxys (preferably $C_1$-$C_{10}$ and more preferably $C_1$-$C_6$), hydroxyls, and polyethylene glycol chains (preferably $C_1$-$C_{10}$ and more preferably $C_1$-$C_6$).

In some embodiments, it is preferred that one or more of $R_1$ to $R_4$ is hydrogen, as too many or very large substituents could create steric hindrance that could impede the polyketanil-forming reaction. A particularly preferred monomer according to the foregoing structure is 4'-aminoacetophenone (i.e., each of $R_1$ to $R_4$ is hydrogen).

Preferred polyketanils for use in the present invention can be polymeric or oligomeric, but when polymerized or oligomerized, the monomers should absorb light at wavelengths of from about 100 nm to about 500 nm, more preferably from about 300 nm to about 400 nm, thus imparting light absorbance properties onto the polyketanils. Advantageously, the imine structure formed from the polyketanil structure produces moderate to high conjugation, giving strong laser absorption at UV wavelengths. One preferred polyketanil has the structure:

where:
each of $R_1$ to $R_4$ can be the same or different; and
each of $R_1$ to $R_4$ is selected from the group consisting of hydrogen, alkyls (preferably $C_1$-$C_{10}$ and more preferably $C_1$-$C_6$), alkoxys (preferably $C_1$-$C_{10}$ and more preferably $C_1$-$C_6$), hydroxyls, and polyethylene glycol chains (preferably $C_1$-$C_{10}$ and more preferably $C_1$-$C_6$).
Again, in the above polymerized structure, it is particularly preferred that each of $R_1$ to $R_4$ is hydrogen.

The above polyketanils can be synthesized using a Schiff base reaction. As noted above, the polyketanil is generally formed by a reaction between an amine and a ketone to form a ketanil bond for the repeating structure of the polyketanil. The reaction is performed at high temperatures, preferably in excess of about 180° C., in the presence of an acid catalyst. Water should be removed from the reaction to push the reaction forward and decrease the ability of the reaction to reverse.

Suitable catalysts for use during polymerization include those selected from the group consisting of sulfuric acid, p-toluenesulfonic acid (pTSA), hydrochloric acid, other strong acids, and mixtures of the foregoing. A weak acid with a high boiling point or a metal-based Lewis acid such as zinc chloride would also be suitable. The amount of catalyst present is typically from about 0.1% to about 5% by molar percent, and preferably from about 0.5% to about 1.5% by molar percent catalyst, based upon the number of moles of monomer.

Suitable solvents for use in the polymerization system include those selected from the group consisting of gamma butyrolactone (GBL), n-methyl-2-pyrrolidone (NMP), dimethylacetamide (DMAc), dimethyl sulfoxide (DMSO), benzyl alcohol, other high-boiling-point polar solvents, and mixtures thereof. The solvent is typically present during polymerization at levels of from about 20% to about 80% by weight, and preferably from about 30% to about 70% by weight solvent, based upon the total weight of all components in the reaction mixture taken as 100% by weight, with the solids being the remainder.

The polymerization reaction is carried out at a temperature of from about 150° C. to about 300° C., and more preferably from about 180° C. to about 200° C., for a time period of from about 12 hours to about 60 hours, more preferably from about 24 hours to about 48 hours. The water/solvent mixture generated during the reaction is preferably removed to allow the reaction to proceed. The crude product is preferably precipitated in an alcohol and dried under vacuum.

Regardless of how the polyketanil is formed, it preferably has a weight average molecular weight of from about 1,000 Daltons to about 100,000 Daltons, preferably from about 1,500 Daltons to about 50,000 Daltons, even more preferably from about 2,000 Daltons to about 10,000 Daltons, as determined by GPC.

2. Polyketanil Compositions

The laser-releasable or build-up compositions for use in the invention are formed by simply dissolving the polyketanil and any optional ingredients in a solvent system. Suitable solvents include those selected from the group consisting of ethyl lactate, cyclopentanone, cyclohexanone, propylene glycol methyl ether acetate (PGMEA), propylene glycol methyl ether (PGME), GBL, benzyl alcohol, and mixtures thereof. Preferably, dissolution is allowed to take place over the course of about 24 hours, while stirring, resulting in a substantially homogeneous solution. The solution is preferably filtered before use.

The final laser-releasable or build-up compositions preferably comprise from about 1% to about 40% by weight solids, more preferably from about 3% to about 25% by weight solids, and even more preferably from about 5% to about 20% by weight solids, based upon the total weight of the composition taken as 100% by weight. These solids are usually about 100% by weight polyketanil, however, in some instances, the solids may be from about 20% to about 100% by weight polyketanil, preferably from about 50% to about 100% by weight polyketanil, and more preferably from about 75% to about 100% by weight polyketanil, based upon the total weight of solids in the composition taken as 100% by weight.

In one embodiment, no other ingredients are included in the composition besides the polyketanil and solvent system. That is, the composition consists essentially of, or even consists of, the polyketanil in the solvent system.

In another embodiment, the composition comprises a polyketanil and a polymer (or more than one polymer) that is not a polyketanil dispersed or dissolved in a solvent system (such as the solvents noted previously). In this embodiment, the solids and solvent levels are as described previously, but the composition comprises:

from 0.1% to about 99.9% by weight polyketanil, more preferably from about 10% to about 90% by weight polyketanil, and even more preferably from about 25% to about 75% by weight polyketanil, based upon the total weight of the solids in composition taken as 100% by weight; and from 0.1% to about 99.9% by weight polymer(s) other than polyketanil, more preferably from about 10% to about 90% by weight polymer(s) other than polyketanil, and even more preferably from about 25% to about 75% by weight polymer(s) other than polyketanil, based upon the total weight of the solids in composition taken as 100% by weight.

In another embodiment, a polyketanil composition as described herein can be blended with a commercially available composition to adjust the properties of that commercially available composition. For example, a commercially available composition that does not have sufficient absorbance at the user's target wavelength (e.g., about 300 nm to about 400 nm) can be blended with a polyketanil composition to increase that commercial composition's absorbance at that wavelength. In this instance, the respective quantities of the solids, solvent, polyketanil, and polymer(s) other than polyketanil will be the same as described in the preceding paragraph.

In one embodiment, the composition is essentially free of crosslinking agents. That is, the composition comprises less than about 3% by weight, preferably less than about 1% by weight, and even more preferably about 0% by weight crosslinking agent, based upon the total weight of the composition taken as 100% by weight. In this embodiment, the polyketanil can be the only polymer or one of a polymer blend, as described above, and at the quantities described previously.

In another embodiment, the composition includes a crosslinking agent. That is, the composition comprises from about 0.1% to about 20% by weight crosslinking agent, more preferably from about 0.5% to about 10% by weight crosslinking agent, and even more preferably from about 1% to about 5% by weight crosslinking agent, based upon the total weight of the polyketanil and any other polymers taken as 100% by weight. In this embodiment, the polyketanil can be the only polymer or one of a polymer blend, as described above, and at the quantities described previously.

In another embodiment, the composition includes one or more encapping agents. The encapping agents contain functional groups that can react with the amine functional group or the ketone functional group of the monomer to slow or stop the polymerization reaction. Suitable endcappers include cyclic anhydrides (such as maleic anhydride, phthalic anhydride, and naphthalic anhydride), monofunctional aldehydes (such as benzaldehyde, trans-2-pentenal, and cinnamaldehyde), monofunctional ketones (such as acetophenone, raspberry ketone, and 2-acetylthiophene), monofunctional primary amines (such as aniline, p-anisidine and 3-amino-4-methylphenol), and monofunctional carboxylic acids (such as benzoic acid, p-toluic acid, and 1-naphthoic acid).

Regardless of the exact formulation, the composition can be used as a laser-releasable composition in a temporary bonding process to temporarily bond a device substrate to a carrier substrate using the processes described below. Additionally, the laser-releasable composition can be used as a build-up composition in a redistribution layer formation process, as also described below.

Methods of Using Laser Releasable or Build-Up Compositions

1. Temporary Bonding Embodiment

Figure 1:
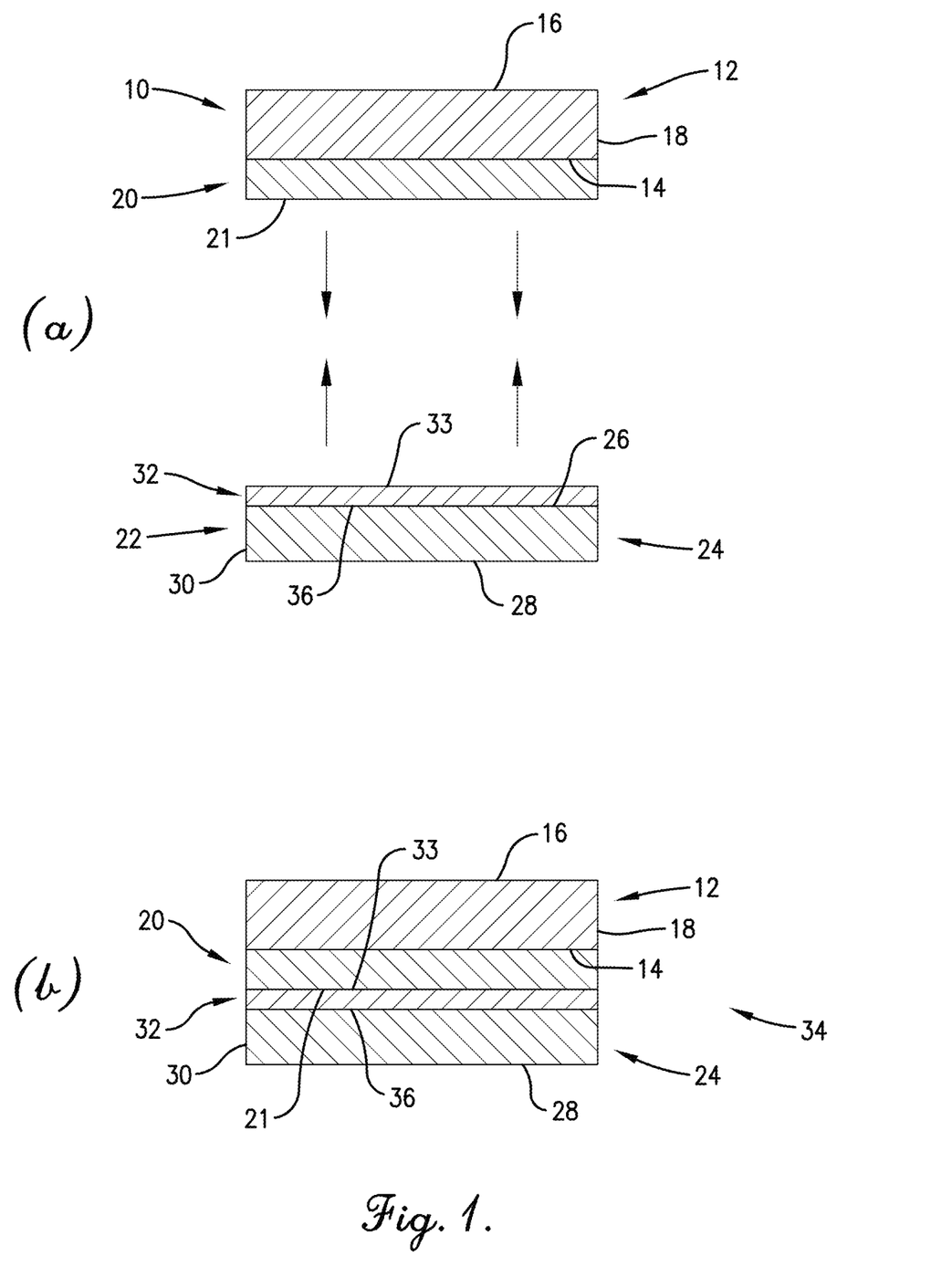
FIG. 1 is a cross-sectional view of a schematic drawing of a temporary bonding process according to one embodiment of the invention.

Referring to FIG. 1(a) (not to scale), a precursor structure 10 is depicted in a schematic and cross-sectional view. Structure 10 includes a first substrate 12. Substrate 12 has a front or device surface 14, a back surface 16, and an outermost edge 18. Although substrate 12 can be of any shape, it would typically be circular in shape. Preferred first substrates 12 include device wafers such as those whose device surfaces comprise arrays of devices (not shown) selected from the group consisting of integrated circuits, MEMS, microsensors, power semiconductors, light-emitting diodes, photonic circuits, interposers, embedded passive devices, and other microdevices fabricated on or from silicon and other semiconducting materials such as silicon-germanium, gallium arsenide, gallium nitride, aluminum gallium arsenide, aluminum indium phosphide, and indium gallium phosphide. The surfaces of these devices commonly comprise structures (again, not shown) formed from one or more of the following materials: silicon, polysilicon, silicon dioxide, silicon (oxy)nitride, metals (e.g., copper, aluminum, gold, tungsten, tantalum), low k dielectrics, polymer dielectrics, and various metal nitrides and silicides. The device surface 14 can also include at least one structure selected from the group consisting of: solder bumps; metal posts; metal pillars; and structures formed from a material selected from the group consisting of silicon, polysilicon, silicon dioxide, silicon (oxy)nitride, metal, low k dielectrics, polymer dielectrics, metal nitrides, and metal silicides.

A composition is applied to the first substrate 12 to form a bonding layer 20 on the device surface 14, as shown in FIG. 1(*a*). Bonding layer 20 has an upper surface 21 remote from first substrate 12, and preferably, the bonding layer 20 is formed directly adjacent the device surface 14 (i.e., without any intermediate layers between the bonding layer 20 and substrate 12). Although bonding layer 20 is shown to cover the entire device surface 14 of first substrate 12, it will be appreciated that it could be present on only portions or "zones" of device surface 14, as shown in U.S. Patent Publication No. 2009/0218560, incorporated by reference herein.

The bonding composition can be applied by any known application method, including dip coating, roller coating, slot coating, die coating, screen printing, draw-down coating, or spray coating. Additionally, the coatings may be formed into free-standing films before application to the device substrate or carrier substrate surface. One preferred method involves spin-coating the composition at speeds of from about 200 rpm to about 5,000 rpm (preferably from about 500 rpm to about 3,000 rpm) for a time period of from about 5 seconds to about 120 seconds (preferably from about 30 seconds to about 90 seconds).

After the composition is applied, it is preferably heated to a temperature of from about 50° C. to about 250° C., and more preferably from about 80° C. to about 220° C. and for time periods of from about 60 seconds to about 8 minutes (preferably from about 90 seconds to about 6 minutes). Depending upon the composition used to form the bonding layer 20, baking can also initiate a crosslinking reaction to cure the layer 20. In some embodiments, it is preferable to subject the layer to a multi-stage bake process, depending upon the composition utilized. Also, in some instances, the above application and bake process can be repeated on a further aliquot of the composition, so that the first bonding layer 20 is "built" on the first substrate 12 in multiple steps. The resulting bonding layer 20 should have an average thickness (average taken over five measurements) of from about 1 μm to about 200 μm, more preferably from about 10 μm to about 150 μm, and even more preferably from about 20 μm to about 120 μm.

The materials from which the bonding layer 20 is formed should be capable of forming a strong adhesive bond with the first substrate 12. Anything with an adhesion strength of greater than about 50 psig, preferably from about 80 psig to about 250 psig, and more preferably from about 100 psig to about 150 psig, as determined by ASTM D4541/D7234, would be desirable for use as a bonding layer.

Advantageously, the compositions for use in forming the bonding layer 20 can be selected from commercially available bonding compositions that would be capable of being formed into a layer possessing the above adhesive properties, while being removable by heat and/or solvent. Typical such compositions are organic and will comprise a polymer or oligomer dissolved or dispersed in a solvent system. The polymer or oligomer is typically selected from a group consisting of polymers and oligomers of cyclic olefins, epoxies, acrylics, silicones, styrenics, vinyl halides, vinyl esters, polyamides, polyimides, polysulfones, polyethersulfones, cyclic olefins, polyolefin rubbers, polyurethanes, ethylene-propylene rubbers, polyamide esters, polyimide esters, polyacetals, polyvinyl butyral, and mixtures of the foregoing. Typical solvent systems will depend upon the polymer or oligomer selection. Typical solids contents of the bonding compositions will range from about 1% to about 60% by weight, and preferably from about 3% by weight to about 40% by weight, based upon the total weight of the composition taken as 100% by weight. Some suitable compositions are described in U.S. Patent Publication Nos. 2007/0185310, 2008/0173970, 2009/0038750, and 2010/0112305, each incorporated herein by reference.

A second precursor structure 22 is also depicted in a schematic and cross-sectional view in FIG. 1(*a*). Second precursor structure 22 includes a second substrate 24. In this embodiment, second substrate 24 is a carrier wafer. That is, second substrate 24 has a front or carrier surface 26, a back surface 28, and an outermost edge 30. Although second substrate 24 can be of any shape, it would typically be circular in shape and sized similarly to first substrate 12. Preferred second substrates 24 include a clear wafer or any other transparent (to laser energy) substrate that will allow the laser energy to pass through the carrier substrate, including, but not limited to, glass, Corning Gorilla glass, and sapphire. One especially preferred glass carrier wafer is a Corning EAGLE XG glass wafer.

A polyketanil composition as described above is applied to the second substrate 24 to form a laser release layer 32 on the carrier surface 26, as shown in FIG. 1(*a*). Alternatively, structure 22 can be provided already formed. Release layer 32 has an upper surface 33 remote from second substrate 24, and a lower surface 36 adjacent second substrate 24. Preferably, the release layer 32 is formed directly adjacent the carrier surface 26 (i.e., without any intermediate layers between the second bonding layer 32 and second substrate 24).

The laser-releasable composition can be applied by any known application method, with one preferred method being spin-coating the composition at speeds of from about 500 rpm to about 3,000 rpm (preferably from about 1,000 rpm to about 2,000 rpm) for a time period of from about 10 seconds to about 120 seconds (preferably from about 30 seconds to about 90 seconds). After the composition is applied, it is preferably heated to a temperature from about 60° C. to about 350° C., and more preferably from about 140° C. to about 250° C. and for time periods from about 30 seconds to about 20 minutes, preferably from about 1 minutes to about 15 minutes. The release layer 32 is then subjected to a high-temperature final bake at a temperature of from about 250° C. to about 350° C., and more preferably from about 280° C. to about 320° C., and preferably for time periods of from about 2 minutes to about 60 minutes, more preferably about 10 minutes.

In one embodiment, this final bake pushes the polymerization reaction to completion by causing a chain extending reaction to take place among two or more of the polyketanil chains present in the laser release layer 32. Thus, in these instances, the polyketanil chains present after heating have a higher molecular weight than the chains present before heating. In embodiments where a crosslinking agent is included, one or both heating stages will cause crosslinking to take place, thus resulting in a crosslinked polyketanil in the release layer 32.

In some embodiments, it is preferable to subject the release layer 32 to a multi-stage bake process, depending upon the composition utilized. Also, in some instances, the above application and bake process can be repeated on a further aliquot of the composition, so that the laser release layer is "built" on the second substrate in multiple steps.

Regardless of the embodiment, after heating, release layer 32 preferably has an average thickness of from about 10 nm to about 5,000 nm, more preferably from about 100 nm to about 1,000 nm, and even more preferably from about 150 nm to about 750 nm. Thicknesses as used herein can be measured using any film thickness measurement tool, with one preferred tool being an infrared interferometer, such as those sold by SUSS Microtec or Foothill.

In a further embodiment, a polyketanil composition according to the invention can be formed into a preformed, dry film rather than applied as a flowable composition. In this instance, the composition is formed into an unsupported, self-sustaining film that doesn't collapse or change shape (absent application of force or energy) even though it is unsupported. This film can then be adhered to the second substrate to form the release layer 32.

The laser release layer 32 will have a k value at the desired wavelength (i.e., the wavelength for debonding or decomposing the bonding layer 20) of at least about 0.1, preferably at least about 0.2, more preferably at least about 0.24, and even more preferably from about 0.24 to about 0.5. Then value of the laser release layer 32 will at least about 1.4, preferably at least about 1.5, more preferably at least about 1.6, and even more preferably from about 1.7 to about 2.

Referring to structure 22 of FIG. 1(a) again, although release layer 32 is shown to cover the entire surface 26 of second substrate 24, it will be appreciated that it could be present on only portions or "zones" of carrier surface 26 similar to as was described with bonding layer 20.

Structures 10 and 22 are then pressed together in a face-to-face relationship, so that upper surface 21 of bonding layer 20 is in contact with upper surface 33 of release layer 32 (FIG. 1(b)). While pressing, sufficient pressure and heat are applied for a sufficient amount of time so as to effect bonding of the two structures 10 and 22 together to form bonded stack 34. The bonding parameters will vary depending upon the composition from which bonding layer 20 is formed, but typical temperatures during this step will range from about 25° C. to about 250° C., and preferably from about 150° C. to about 220° C., with typical pressures ranging from about 1,000 N to about 25,000 N, and preferably from about 3,000 N to about 10,000 N, for a time period of from about 30 seconds to about 20 minutes, and preferably from about 3 minutes to about 10 minutes.

In an alternative embodiment, it will be appreciated that bonding layer 20 could be applied to upper surface 33 of release layer 32, using the application process described previously, rather than being applied to surface 14 of first substrate 12. In this instance, the first substrate 12 would then be subjected to the above bonding process so as to bond surface 14 of first substrate 12 to bonding layer 20, which was previously formed on upper surface 33 of release layer 32.

The bonded stack should have a TTV of less than about 10% of the total average thickness, preferably less than about 5% of the total average thickness (measured at five locations across the stack), and even more preferably less than about 3% of the total average thickness of the bonded stack. That is, if the bonded stack has an average thickness of 100 μm, TTV of less than about 10% would be about 10 μm or lower.

Regardless of which embodiment was used to form the bonded stack 34, the first substrate 12 can now be safely handled and subjected to further processing that might otherwise have damaged first substrate 12 without being bonded to second substrate 24. Thus, the structure can safely be subjected to backside processing such as back-grinding, chemical-mechanical polishing ("CMP"), etching, metal deposition (i.e., metallization), dielectric deposition, patterning (e.g., photolithography, via etching), passivation, annealing, and combinations thereof, without separation of substrates 12 and 24 occurring, and without infiltration of any chemistries encountered during these subsequent processing steps. Not only can bonding layer 20 and release layer 32 survive these processes, they can also survive processing temperatures up to about 300° C., preferably from about 150° C. to 280° C., and more preferably from about 180° C. to about 250° C. for at least about 60 minutes, and preferably from about 90 minutes to about 15 hours.

Once processing is complete, the substrates 12 and 24 can be separated by using a laser to decompose or ablate all or part of the laser release layer 32. Suitable laser wavelengths include those of from about 200 nm to about 400 nm, and preferably from about 300 nm to about 360 nm. In order to debond the laser release layer 32, a laser is scanned across the surface of the substrate 24 in a stand-and-repeat method or line scan method in order to expose the entire wafer. Exemplary laser debonding tools include the SUSS Micro-Tec Lambda STEEL 2000 laser debonder and Kingyoup laser debonder. The substrate 24 is preferably scanned by the laser spot with a field size from about 40×40 μm to about 12.5×4 mm. Suitable fluence to debond the substrates 12, 24 is from about 100 mJ/cm$^2$ to about 400 mJ/cm$^2$, and preferably from about 150 mJ/cm$^2$ to about 350 mJ/cm$^2$. Suitable power to debond the substrates 12, 24 is from about 0.5 W to about 6 W, and preferably from about 1 W to about 2 W.

After laser exposure, the substrates 12 and 24 will readily separate. After separation, any remaining bonding layer 20 can be removed with a plasma etch or a solvent capable of dissolving the bonding layer 20.

For the plasma cleaning, $O_2$ plasma may be used alone, or a combination of $O_2$ plasma and fluorinated gas in a ratio of from about 1:1 to about 10:1 may be used, at a power of 100 W and higher.

Solvent cleaning can be performed by bath or spin cleaning process. Suitable solvents include for nonpolar bonding materials include, but are not limited to, d-limonene, mesitylene, 1-dodecene, and combinations thereof. Suitable solvents for cleaning polar bonding materials include GBL, cyclopentanone, benzyl alcohol, DMSO, cyclohexanone, PGME, PGMEA, NMP, 1,3-dioxolane, and combinations thereof.

When a spin cleaning process is used, it is preferably performed for about 1 minute to about 15 minutes of clean time. In the spin cleaning process, solvent is sprayed in the center of the wafer with a combination of puddle and soak cycle and then is spun off. For a puddle and soak cycle, solvent is sprayed in the center of the wafer and puddled out at a spin speed of from about 20 rpm to about 150 rpm and is soaked with no solvent spraying or rotation of the wafer for about 30 seconds to about 90 seconds. In the final step, solvent is dispensed in the center of the substrate, and the substrate is spun at a spin speed of from about 750 rpm to about 1,500 rpm.

In the above embodiments, the release layer 32 is shown on a second substrate 24 that is a carrier wafer, while bonding layer 20 is shown on a first substrate 12 that is a device wafer. It will be appreciated that this substrate/layer scheme could be reversed. That is, the release layer 32 could be formed on first substrate 12 (the device wafer) while bonding layer 20 is formed on second substrate 24 (the carrier wafer). The same compositions and processing conditions would apply to this embodiment as those described above, except that bonding layer 20 would be selected so that laser energy could pass through it, after passing through second substrate 24, thus allowing the laser energy to make contact with release layer 32.

Additionally, it will be appreciated that bonding layer 20 and release layer 32 could be used with or as additional bonding materials, structural support layers, lamination aid layers, tie layers (for adhesion to initial substrate), contamination control layers, and cleaning layers. Preferred structures and application techniques will be dictated by application and process flow.

2. Build-Up Layer Embodiment

In a further embodiment, the polyketanil compositions described herein can be used as a build-up layer for redistribution layer ("RDL") formation, and particularly in RDL-first/chip-last packaging in wafer- or panel-level processes, which is good for minimizing or even avoiding known-good die loss during packaging. A schematic of one such process is shown in FIG. 2.

Figure 2:
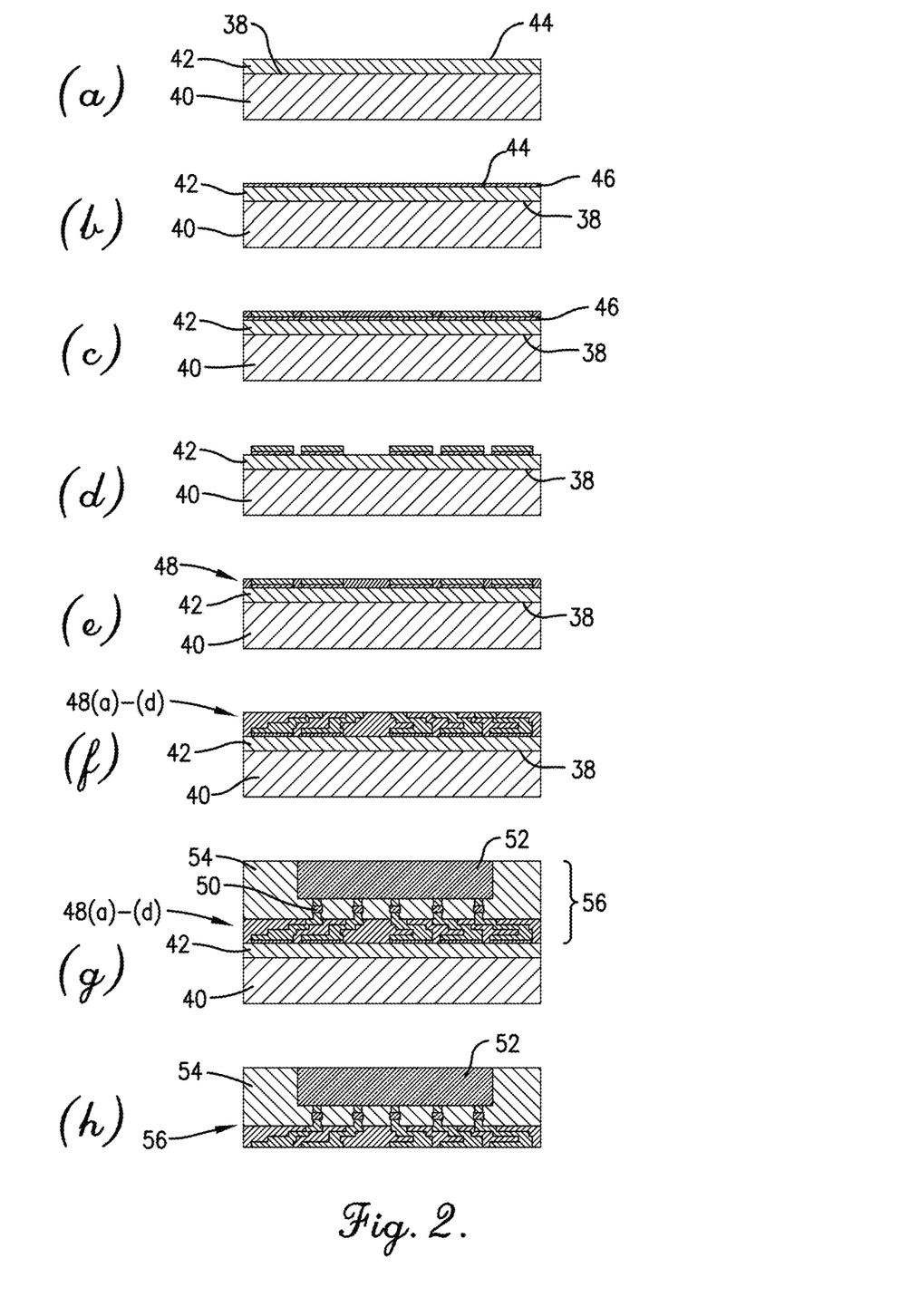
FIG. 2 is a schematic drawing illustrating redistribution layer formation according to another embodiment of the invention.

A polyketanil composition as described previously is applied to the upper surface 38 of a carrier substrate 40 to form a laser-releasable build-up layer 42 on the carrier surface 38, as shown in FIG. 2(*a*). Build-up layer 42 is formed following any of the methods described with respect to the temporary bonding embodiment above, including the processing conditions and resulting properties. Build-up layer 42 has an upper surface 44 remote from carrier substrate 40, and preferably the build-up layer 42 is formed directly on the upper surface 38 of carrier substrate 40 (i.e., without any intermediate layers between the build-up layer 42 and substrate 40).

Next, a seed layer 46 is deposited on upper surface 44 following conventional methods (FIG. 2(*b*)). The seed layer 46 can then be coated with a photoresist, patterned, and electroplated, again following known methods, forming the structure shown in FIG. 2(*c*). Referring to FIG. 2(*d*), the photoresist is stripped, and the metal etched, followed by coating, patterning, and curing of a dielectric layer. This results in the formation of the first RDL 48, as shown in FIG. 2(*e*). The steps of FIG. 2(*b*) to FIG. 2(*e*) can be repeated multiple times, as needed, to create multiple RDLs (48(*a*)-(*d*), i.e., four RDLs, in the embodiment shown in FIG. 2(*f*)).

Referring to FIG. 2(*g*), after the desired number of RDLs have been formed, solder balls 50 are attached to the uppermost (last formed) RDL, again following conventional methods. A die 52 is bonded to solder balls 50, followed by application and grinding of a conventional epoxy molding layer 54, forming a fan-out wafer level package structure 56. Finally, laser energy is applied to the carrier substrate 40, following previously described laser separation conditions, so as to decompose or ablate all or part of the laser-releasable build-up layer 42. After laser application, the carrier substrate 40 will be released and separated from fan-out wafer level package structure 56 (FIG. 2(*h*)), with any remaining build-up layer 42 being removed by a solvent.

It should be noted that the above-described process for forming fan-out wafer level package structures is only one example of this type of process that can be carried out using the inventive composition as a build-up layer, and that variations of this process can and will be made, depending upon user needs. For example, the number of RDL layers can be varied, as needed, as well as the number and positioning of solder balls and dies. These arrangements will be understood and customized by one skilled in this art.

As can be seen above, the present invention offers many advantages. The polyketanils (and thus layers formed therefrom) offer high absorbances at a wide variety of wavelengths, including those primarily used for laser debond (about 300 nm to about 400 nm) to all the way up to the visible range of light. Additionally, the high absorbances of the polyketanils allow for casting of thinner films on the wafer while still absorbing most to all of the laser energy to prevent device damage. The high absorbances also offer benefits to reducing the laser energy and time required to debond the wafers. And along with the direct benefits to laser debonding, these materials can also be used in RDL-first processes. The polymers can utilize various monomers, allowing the structures to become insoluble by crosslinkable groups or chain extension. This class of polymers can provide thermal stability of 300° C. or greater, provide good adhesion to silicon as well as glass substrates, and can be removed by dry-etch (plasma etching) with similar etch rates as polyimides. Finally, due to the thinner films required, stress and bow can be reduced on both silicon and glass substrates.

Additional advantages of the various embodiments will be apparent to those skilled in the art upon review of the disclosure herein and the working examples below. It will be appreciated that the various embodiments described herein are not necessarily mutually exclusive unless otherwise indicated herein. For example, a feature described or depicted in one embodiment may also be included in other embodiments but is not necessarily included. Thus, the present invention encompasses a variety of combinations and/or integrations of the specific embodiments described herein.

"Polyketanil" when included in a composition or a layer above is intended to include a single type of polyketanil as well as two or more different types of polyketanils, unless stated otherwise. Additionally, as used herein, the phrase "and/or," when used in a list of two or more items, means that any one of the listed items can be employed by itself or any combination of two or more of the listed items can be employed. For example, if a composition is described as containing or excluding components A, B, and/or C, the composition can contain or exclude A alone; B alone; C alone; A and B in combination; A and C in combination; B and C in combination; or A, B, and C in combination.

The present description also uses numerical ranges to quantify certain parameters relating to various embodiments of the invention. It should be understood that when numerical ranges are provided, such ranges are to be construed as providing literal support for claim limitations that only recite the lower value of the range as well as claim limitations that only recite the upper value of the range. For example, a disclosed numerical range of about 10 to about 100 provides literal support for a claim reciting "greater than about 10" (with no upper bounds) and a claim reciting "less than about 100" (with no lower bounds).

EXAMPLES

The following examples set forth methods in accordance with the invention. It is to be understood, however, that these examples are provided by way of illustration and nothing therein should be taken as a limitation upon the overall scope of the invention.

Example 1

Polymerization to Form Polyketanil

In this procedure, 13.07 grams of 4'-aminoacetophenone (Alfa Aesar, Haverhill, Mass.) were dissolved in 20.76 grams of gamma butyrolactone (GBL, Sigma Aldrich, St. Louis, Mo.) in a four-necked 1-liter round-bottom flask. The flask was equipped with a heating mantle, temperature controller, thermal probe, Dean-Stark trap and overhead stirrer with stir bar and paddle mixer. A condenser was attached to the Dean-Stark trap. Nitrogen flow was initiated to the flask, and the reaction was heated to 110° C. Next, 0.06 grams (0.18%) of 96% sulfuric acid (KMG Chemicals, Ft. Worth, Tex.) was added to the solution, and then the solution was heated to 185° C. The water and GBL mixture was collected in the Dean-Stark trap (~7% of the total solution weight) and was not added back into the system. The solution was allowed to react for 48 hours and then was cooled to room temperature. The resulting solution was approximately 35% solids, and was a dark red, slightly viscous solution. The cooled solution was then bottled for further use.

Example 2

Preparation of Polyketanil Composition

In the Example, 634.20 grams of the solution from Example 1 was mixed with 665.86 grams of ethyl lactate (KMG Chemicals, Ft. Worth, Tex.) by an overhead stir motor. The mixture was stirred until all solids were in solution. The resulting solution was then filtered using a 0.2-µm Meissner filter.

Example 3

Characterization of Polyketanil Composition

1. Optical Properties

Figure 3:
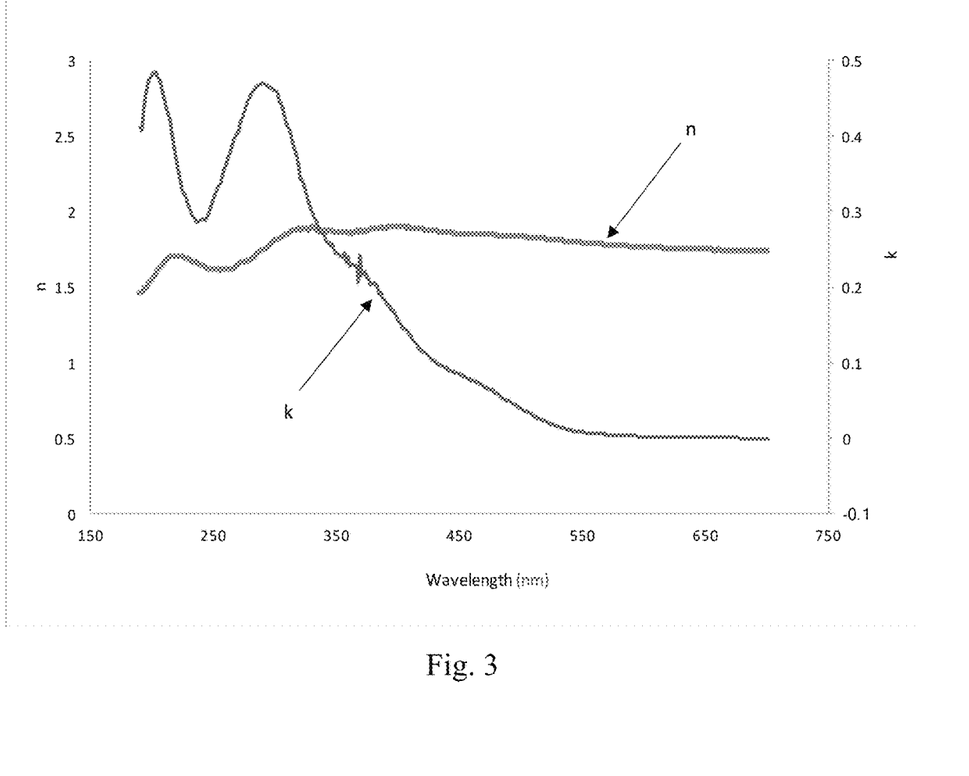
FIG. 3 is a graph showing the spectra of n and k values as determined in Example 3.

The material prepared in Example 2 was coated on a 100-mm Si wafer. This coating was accomplished by spin coating at 1,500 rpm with an acceleration of 1,500 rpm/s for 60 seconds. The carrier wafer was then baked at 150° C. for 2 minutes, 220° C. for 2 minutes, 250° C. for 5 minutes, and 300° C. for 10 minutes. The coated wafer was then run on a VASE M2000 ellipsometer to obtain raw optical data. The data was then fit for thickness and optical properties (n & k values). The wavelengths of interest were 308 nm, 343 nm, and 355 nm. The results are summarized in Table 1, and the full spectrum is shown in FIG. 3.

TABLE 1

| Optical constants | | |
| --- | --- | --- |
| Wavelength (nm) | n | k |
| 308 | 1.84 | 0.43 |
| 343 | 1.87 | 0.26 |
| 355 | 1.86 | 0.24 |

2. Thickness, Molecular Weight, and Polydispersity Index

The material prepared in Example 2 was coated on a 200-mm glass wafer. This coating was accomplished by spin coating at 1,500 rpm with an acceleration of 1,500 rpm/s for 60 seconds. The carrier wafer was then baked at 150° C. for 2 minutes, 220° C. for 2 minutes, 250° C. for 5 minutes, and 300° C. for 10 minutes. The coated wafer was then analyzed on an FRT Microprof® 300 tool using a 1×1 mm resolution point map scan, resulting in an average thickness value of 673.48 nm and a TTV of 32.89 nm with a 1% high and low data exclusion.

GPC was performed with a Waters 717 liquid chromatography system using NMP, THF, acetic acid, and lithium bromide and a mobile phase flow of 1 ml/min. Detection was accomplished with a Waters 410 differential refractive index detector, and the signal was integrated and quantitated using relative calibration with polystyrene standards. Table 2 shows these results.

TABLE 2

| Average Molecular Weight and Polydispersity Index ("PDI") | | | |
| --- | --- | --- | --- |
| Mw (Daltons) | Mn (Daltons) | Mz (Daltons) | PDI |
| 2809 | 1623 | 4682 | 1.73 |

Example 4

Bonding Using Formulation of Example 2

The material prepared in Example 2 was coated on a 200-mm glass wafer as a carrier wafer. This coating was accomplished by spin coating at 1,500 rpm with an acceleration of 1,500 rpm/s for 60 seconds. The carrier wafer was then baked at 60° C. for 2 minutes, 120° C. for 2 minutes, 250° C. for 5 minutes, and 300° C. for 10 minutes. An experimental phenoxy-based thermoplastic bonding material (Brewer Science, Rolla, Mo.) was coated on a 200-mm silicon wafer as a simulated device wafer. This coating was accomplished by spin coating at 1,500 rpm with an acceleration of 3,000 rpm/s for 30 seconds. The carrier wafer was then baked at 60° C. for 5 minutes, 160° C. for 5 minutes, and 220° C. for 5 minutes. The coated carrier wafer was bonded to the coated device wafer by bonding at 200° C., 3000 N for 3 minutes under vacuum (<5 mbar) in an EVG® 510 bonding system (EV Group).

Example 5

Laser Debonding and Cleaning Using Formulation of Example 2

The bonded wafer pairs were successfully debonded by using the three major UV-laser wavelengths currently used by the industry. A different piece of debonding equipment was used for each wavelength, and that equipment was: a SUSS ELD12 Laser Debonder (Garching bei München, Germany); an EVG Semi-Automatic Debonding System (St. Florian/Inn, Austria); and a Kingyoup LD-Semi Automatic 200/300 (New Taipei City, Taiwan). The laser debonding parameters and results from the SUSS, Kingyoup, and EVG debonders are shown in Tables 3, 4, and 5, respectively.

TABLE 3

| Laser Debonding Parameters and Results for SUSS Debonder | |
| --- | --- |
| FLUENCE (mJ/cm$^2$) | RESULTS (beam size of 12.5 × 4 mm and overlap of 100-200 µm) |
| 160 | Debonded Successfully; low residue observed |
| 200 | Debonded Successfully; higher residue observed |

TABLE 4

Results from Kingyoup Debonder

| POWER (W) | SCAN SPEED (m/s) | LINE PITCH (μm) | SCAN TIME (s) | RESULT (beam size of 60 μm) |
|---|---|---|---|---|
| 2 | 3.5 | 70 | 128.2 | Debonded Successfully |
| 1.5 | 3.4 | 69 | 133.9 | Debonded Successfully |
| 1.2 | 2.6 | 53 | 228.0 | Debonded Successfully |

TABLE 5

Results from EVG Debonder

| FLUENCE (mJ/cm$^2$) | RESULT (beam size of 40 × 40 μm and pitch size of 40 μm) |
|---|---|
| 750 | Debonded successfully; showed very low carbon residue |
| 500 | Debonded successfully; showed no carbon residue and no transmittance through UV tape |

Example 6

Blending of Polyketanil with Low Absorbing Material

The procedure was carried out to show how the inventive polymers and compositions can be blended with other polymer compositions to improve the properties of those polymer compositions. In this instance, the other polymer composition included a 12% weight solution of a commercially available polyimide, which is low absorbing at 300-400 nm, in a GBL-cyclopentanone solvent mixture (referred to as "Polyimide Solution").

A 17.5% by weight solution of the material prepared Example 1 was mixed with cyclopentanone (obtained from FujiFilm) in a 1:1 weight ratio (referred to as "Polyketanil Additive"). The Polyketanil Additive was mixed with the Polyimide Solution at different ratios, with the weights of each being summarized in Table 6.

TABLE 6

Weights of Polyketanil Additive and Polyimide Solution Blended

| WT. OF POLYKETANIL ADDITIVE (g) | WT. OF POLYIMIDE SOLUTION (g) | ADDITIVE PERCENT* |
|---|---|---|
| 1.03 | 5.14 | 16.7% |
| 2.08 | 5.07 | 29.1% |
| 3.02 | 5.02 | 37.5% |
| 4.03 | 5.16 | 43.8% |

$$ * \left[ \frac{\text{Wt. of Polyketanil Additive}}{(\text{Wt. of Polyketanil Additive} + \text{Wt. of Polyimide Solution})} \right] \times 100 $$

The prepared solutions were spin coated to obtain films thin enough to measure the absorbance (k) ranging from A thickness of 100 nm to 500 nm. This coating was accomplished by spin coating at 1,500 rpm with an acceleration of 1,500 rpm/s for 60 seconds. The wafers were baked at 60° C. for 2 minutes, 150° C. for 2 minutes, and 220° C. for 5 minutes. The coated wafer was then run on a VASE M2000 ellipsometer to obtain raw optical data. The data was then fit for thickness and optical properties (n & k values). The wavelengths of interest were 308 nm, 343 nm, and 355 nm. These results are summarized in Table 7.

TABLE 7

Change of k Values at Major Wavelengths with Different Percentage of Polyketanil Additive

| POLYKETANIL ADDITIVE % | k VALUE AT 308 NM | k VALUE AT 343 nm | k VALUE AT 355 nm |
|---|---|---|---|
| 0.00% | 0.08 | 0.03 | 0.03 |
| 43.84% | 0.27 | 0.15 | 0.14 |
| 37.51% | 0.21 | 0.13 | 0.12 |
| 29.13% | 0.19 | 0.11 | 0.10 |
| 16.72% | 0.14 | 0.07 | 0.07 |

We claim:

1. A temporary bonding method comprising:
   providing a stack comprising:
   a first substrate having a back surface and a front surface;
   a bonding layer adjacent said front surface;
   a second substrate having a first surface; and
   a release layer between said first surface and said bonding layer, said release layer comprising a polyketanil; and
   exposing said release layer to laser energy so as to facilitate separation of said first and second substrates.

2. The method of claim 1, wherein said polyketanil is crosslinked.

3. The method of claim 1, wherein said polyketanil is a polymer of a monomer comprising an amine functional group, a ketone functional group, and an aromatic moiety, wherein said amine functional group and said ketone functional group are bonded to said aromatic moiety.

4. The method of claim 3, wherein said recurring monomer is 4-aminoacetophenone.

5. The method of claim 1, further comprising one or both of the following:
   said front surface is a device surface that comprises an array of devices selected from the group consisting of integrated circuits; MEMS; microsensors; power semiconductors; light-emitting diodes; photonic circuits; interposers; embedded passive devices; and microdevices fabricated on or from silicon, silicon-germanium, gallium arsenide, gallium nitride, and combinations of the foregoing; or
   said first surface is a device surface that comprises an array of devices selected from the group consisting of integrated circuits; MEMS; microsensors; power semiconductors; light-emitting diodes; photonic circuits; interposers; embedded passive devices; and microdevices fabricated on or from silicon, silicon-germanium, gallium arsenide, gallium nitride, and combinations of the foregoing.

6. The method of claim 1, wherein one or both of said first substrate or said second substrate comprises glass or other transparent material.

7. The method of claim 1, further comprising one or both of the following:
   said front surface is a device surface comprising at least one structure selected from the group consisting of: solder bumps; metal posts; metal pillars; and structures formed from a material selected from the group consisting of silicon, polysilicon, silicon dioxide, silicon (oxy)nitride, metal, low k dielectrics, polymer dielectrics, metal nitrides, metal silicides, and combinations of the foregoing; or
   said first surface is a device surface comprising at least one structure selected from the group consisting of:

solder bumps; metal posts; metal pillars; and structures formed from a material selected from the group consisting of silicon, polysilicon, silicon dioxide, silicon (oxy)nitride, metal, low k dielectrics, polymer dielectrics, metal nitrides, metal silicides, and combinations of the foregoing.

8. The method of claim 1, further comprising subjecting said stack to processing selected from the group consisting of back-grinding, chemical-mechanical polishing, etching, metallizing, dielectric deposition, patterning, passivation, annealing, and combinations thereof, prior to separating said first and second substrates, prior to separating said first and second substrates.

9. The method of claim 1, wherein said providing comprises bonding said first and second substrate together to form said stack.

* * * * *